United States Patent

Norimatsu

[11] Patent Number: 5,483,682
[45] Date of Patent: Jan. 9, 1996

[54] APPARATUS FOR CONTROLLING AN EFFICIENCY CONTROL SIGNAL TO BE SUPPLIED TO A POWER AMPLIFICATION CIRCUIT IN A TIME DIVISION MULTIPLE ACCESS MODE

[75] Inventor: Hidehiko Norimatsu, Tokyo, Japan

[73] Assignee: NEC Corporation, Tokyo, Japan

[21] Appl. No.: 149,120

[22] Filed: Nov. 9, 1993

[30] Foreign Application Priority Data

Nov. 9, 1992 [JP] Japan ................................. 4-297541

[51] Int. Cl.$^6$ ........................... H03G 3/20; H04B 4/04
[52] U.S. Cl. ..................... 455/127; 455/115; 455/126; 330/275
[58] Field of Search ...................... 455/115, 117, 455/126, 127; 330/279, 297, 278

[56] References Cited

U.S. PATENT DOCUMENTS 5,129,098  7/1992  McGirr et al. ............... 455/127 X
5,287,555  2/1994  Wilson et al. ............... 455/127 X

FOREIGN PATENT DOCUMENTS 0172704   2/1986   European Pat. Off. .
0239467   9/1987   European Pat. Off. .
0462952  12/1991   European Pat. Off. .

Primary Examiner—Chi H. Pham
Attorney, Agent, or Firm—Young & Thompson

[57] ABSTRACT

A current flowing from a power supply to a power amplification circuit is detected at two adjacent transmission periods having a non-transmission period therebetween. Between the two transmission periods, whether the current is increased or decreased is detected. When the increase is detected, an efficiency control signal is obtained to be supplied to the power amplification circuit by subtracting an increased amount between the two preceding transmission periods from an efficiency control signal used at the last preceding transmission period, and, when the decrease is detected, the efficiency control signal is obtained to be supplied to the power amplification circuit by adding the increased amount to the efficiency control signal used at the last preceding transmission period.

9 Claims, 3 Drawing Sheets

APPARATUS FOR CONTROLLING AN EFFICIENCY CONTROL SIGNAL TO BE SUPPLIED TO A POWER AMPLIFICATION CIRCUIT IN A TIME DIVISION MULTIPLE ACCESS MODE

FIELD OF THE INVENTION

This invention relates to an apparatus for adjusting the efficiency of RF power amplification, and more particularly to an apparatus for adjusting the RF power amplifying efficiency in which the power consumption of a mobile station is minimized in a TDMA (time division multiple access) radio communication system.

BACKGROUND OF THE INVENTION

A conventional apparatus for adjusting the efficiency of power amplification is used in a portable telephone set such as Cellular type telephone set in which transmission and receipt of signals are carried out simultaneously.

In the conventional apparatus for adjusting power amplification efficiency, electric power is supplied via a control circuit to a power amplification circuit, and the control circuit detects the electric power to be supplied to the power amplification circuit, so that the electric power is minimized dependent on an efficiency control signal supplied from the control circuit to the power amplification circuit, provided that an output signal of the power amplification circuit is controlled to be constant by the control circuit. This is defined as "efficiency control", and the efficiency control is constantly carried out at the time of transmission.

In conventional apparatus for adjusting the power amplification efficiency, however, there is a disadvantage in that an optimum efficiency is difficult to be obtained in the case where transmission is carried out instantly in a burst mode. Further, there is a disadvantage in that noise is generated on a transmission output signal, and the transmission output signal fluctuates, when a power amplification factor is adjusted during signal transmission.

SUMMARY OF THE INVENTION

Accordingly, it is an object of the invention to provide an apparatus for adjusting the efficiency of power amplification in which the power amplification is carried out by an optimum efficiency, even in the case where signals are transmitted in burst mode.

It is a further object of the invention to provide an apparatus for adjusting the efficiency of power amplification in which noise carried on a transmission signal is reduced, and no fluctuation occurs in an output signal, even if an amplification factor is adjusted in an power amplification circuit during the signal transmission.

According to the invention, an apparatus for adjusting the efficiency of electric power amplification, comprises:

a power amplification circuit for amplifying a signal to be transmitted in a time division multiple access mode; and a control circuit for controlling the efficiency of power amplification in the power amplification circuit;

wherein the efficiency is controlled in the control circuit to be an optimum value at a period not belonging to a period for the signal to be transmitted.

BRIEF DESCRIPTION OF THE DRAWINGS

The invention will be explained in more detail in conjunction with appended drawings, wherein.

DETAILED DESCRIPTION OF THE PREFERRED EMBODIMENTS

Figure 1:
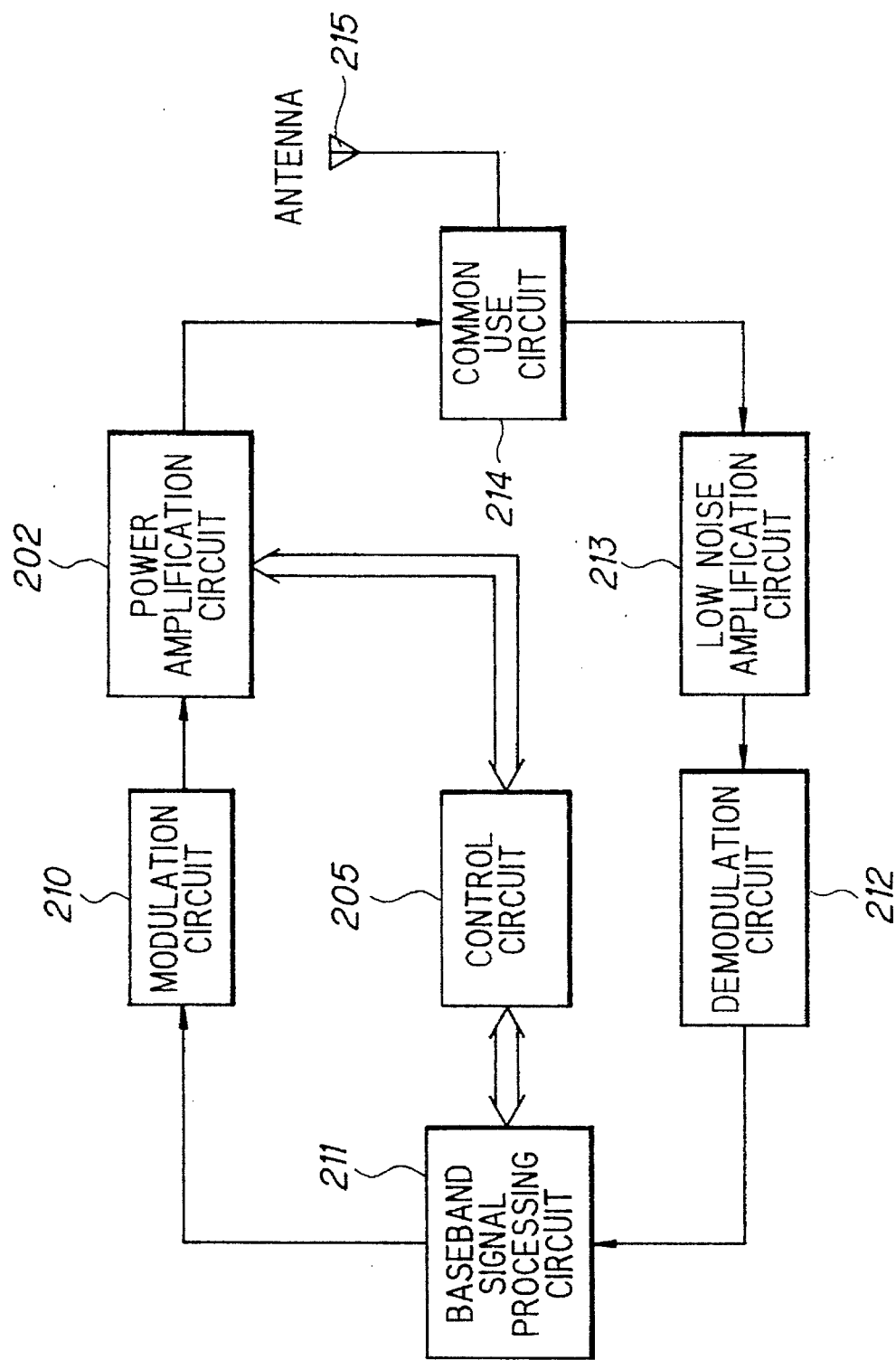
FIG. 1 is a conventional block diagram showing a mobile station.

FIG. 1 shows a mobile station including a conventional apparatus for adjusting the efficiency of power amplification. The mobile station comprises a baseband signal processing circuit 211 for generating a baseband signal, a modulation circuit 210 for modulating the baseband signal by a signal to be transmitted, a power amplification circuit 202 for amplifying the modulated signal, a common use circuit 214 for supplying the amplified signal to an antenna 215, from which the amplified signal is transmitted, and for supplying a signal received by the antenna 215 to a low noise amplification circuit 213, in which the received signal is amplified by suppressing the generation of noise, a demodulator 212 for demodulating the received signal supplied from the low noise amplifier 213 to obtain a transmitted signal, and a control circuit 205 for controlling the power amplification circuit 202 to amplify the modulated signal by a controlled efficiency and the baseband signal processing circuit 211 to generate the baseband signal.

Figure 2:
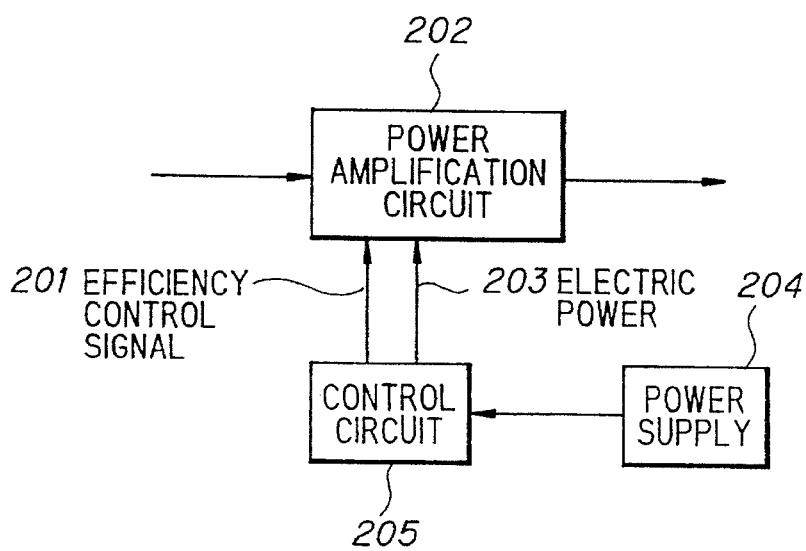
FIG. 2 is a block diagram showing a conventional apparatus for adjusting the efficiency of power amplification included in the mobile station.

FIG. 2 shows the conventional apparatus for adjusting the efficiency of power amplification which comprises the control circuit 205 as shown in FIG. 1, a power supply 204 and the power amplification circuit 202 is also shown in FIG. 1.

In operation, a baseband signal is generated in the baseband signal processing circuit 211 by processing a received baseband signal supplied from the demodulator 212. The baseband signal thus generated is modulated in the modulation circuit 210 to provide the modulated signal by a signal to be transmitted from the antenna 215, and the modulated signal is amplified in the power amplification circuit 202 by the control circuit 205.

In the control circuit 205, an electric power 203 supplied from the power supply 204 to the power amplification circuit 202 is detected, and the detected electric power 203 is controlled to be minimized by generating an efficiency control signal 201 to be supplied to the power amplification circuit 202. Consequently, a power amplification efficiency is adjusted in the power amplification circuit 202, so that an output signal of the power amplification circuit 202 is controlled to be constant during the whole time of a signal transmission period. Thus, a constant power of the modulated and amplified signal is transmitted via the common use circuit 214 from the antenna 215. In this explanation, a signal receiving operation is omitted, because it is self-explanatory.

However, the aforementioned disadvantages occur in the conventional apparatus for adjusting the efficiency of power amplification.

Figure 3:
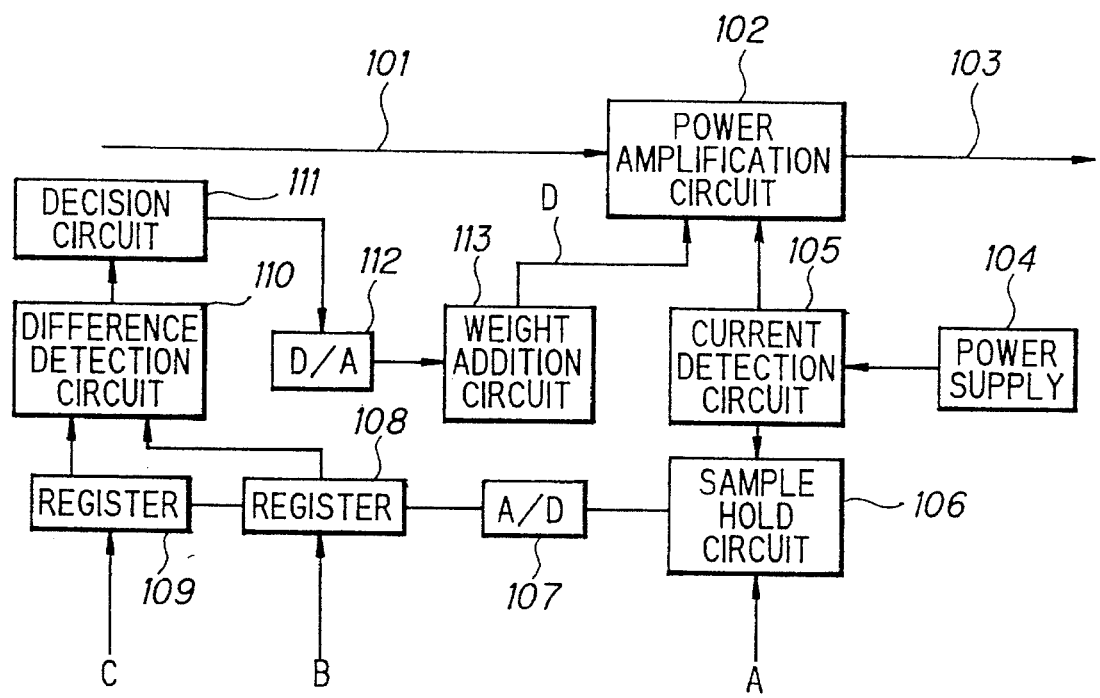
FIG. 3 is a block diagram showing an apparatus for adjusting the efficiency of power amplification in a first preferred embodiment according to the invention.

Next, an apparatus for adjusting the efficiency of power amplification in the preferred embodiment according to the invention will be explained in FIG. 3.

The apparatus for adjusting the efficiency of power amplification comprises a power amplification circuit 102, a power supply 104, a current detection circuit 105, a sample hold circuit 106, an analog to digital (A/D) converter 107, registers 108 and 109, a difference detection circuit 110, a decision circuit 111, and a digital to analog converter circuit 112, and a weight addition circuit 113.

Figure 4A:
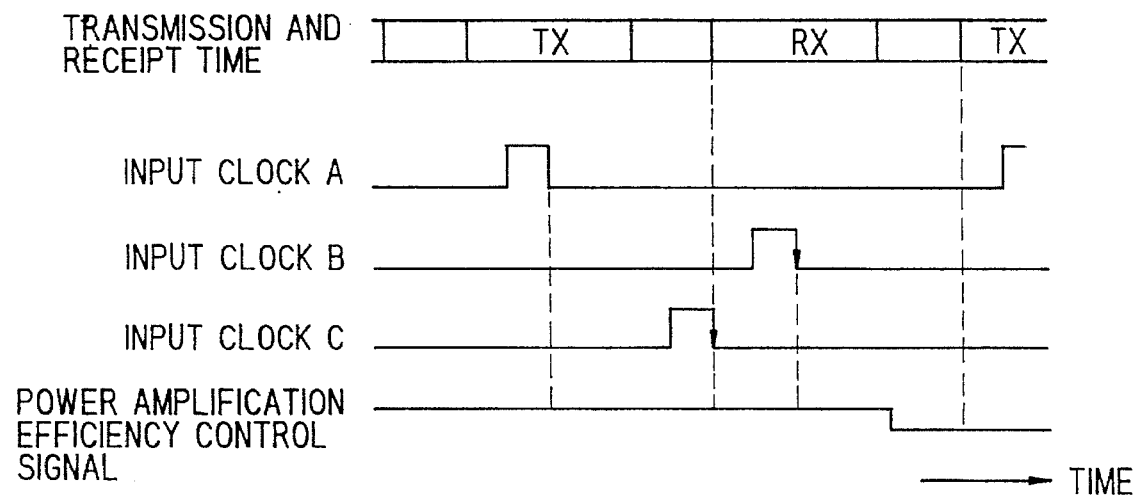
FIG. 4A is a timing chart explaining operation in the first preferred embodiment.

In operation (to be explained in FIG. 4A), an input signal 101 is amplified in the power amplification circuit 102 to generate an output signal 103, wherein an electric power is supplied via the current detection circuit 105 from the power supply 104 to the power amplification circuit 102. A current value detected in the current detection circuit 105 is supplied to the sample hold circuit 106, in which the current value is sampled at a rising edge of an input clock A generated at a transmission time TX and held at a falling edge of the input clock A. The current value held in the sample hold circuit 106 is converted in the A/D converter 107 from an analog value to a digital value. A content of the register 108 is read to be stored in the register 109 at a rising edge of an input clock C generated prior to a receipt time RX, and supplied therefrom to the difference detection circuit 110 at the same time, and the register 108 reads a content of the A/D converter 107 at a rising edge of an input clock B generated at the receipt time RX. In other words, the content of the A/D converter 107 and the register 108 are transferred to the register 108 and the register 109, respectively, at a period prior to a subsequent transmission time TX.

Figure 4B:
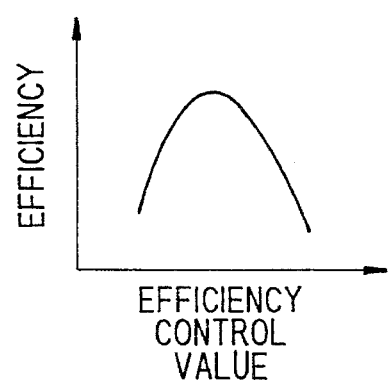
FIG. 4B is a graph explaining the relation between the efficiency control value and the efficiency.

Then, the contents of the registers 108 and 109 are supplied to the difference detection circuit 110, so that a difference between the contents thereof is detected therein to be supplied to the decision circuit 111. The decision circuit 111 has stored an increased amount between a former output value of the decision circuit 111 and an output value preceding the former output value, wherein the decision circuit 111 decides whether the detected current in the current detection circuit 105 is increased or not in accordance with the difference supplied from the difference detection circuit 110. Here, it is assumed that the power amplification circuit 102 has a property as shown in FIG. 4B. Thus, when it is detected in the decision circuit 111 that, the detected current is increased, an output value (present control value) of the decision circuit 111 is a value obtained by adding a polarity-inverted value of the increased (stored) amount to the former output value, and, when it is detected in the decision circuit 111 that the detected current is decreased, the output value of (present control value) of the decision circuit 111 is a value obtained by adding the increased (stored) amount to the former output value. The present control value is supplied to the D/A converter 112, in which an analog control signal is obtained, and the analog control signal is amplified in the weight addition circuit 113, so that the amplified control signal is supplied as an amplification efficiency control signal D to the power amplification circuit 102. This control is repeated to provide an optimum power amplification efficiency.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. An apparatus for adjusting the efficiency of power amplification, comprising:

a power amplification circuit for amplifying a signal to be transmitted in a time division multiple access mode; and a control circuit for controlling the efficiency of power amplification in said power amplification circuit comprising a circuit for detecting an electric current supplied from a power supply to said power amplification circuit;

wherein said efficiency is controlled in said control circuit by one of a sum and a difference of values of said electric current detected at two adjacent transmission periods, said efficiency being controlled to be an optimum value at a period not belonging to a period for said signal to be transmitted.

2. An apparatus for adjusting the efficiency of power amplification, according to claim 1, wherein:

said control circuit further comprises a first register for storing said electric current at a first transmission period, a second register for storing said electric current at a second transmission period, said second transmission period following said first transmission period by allocating a non-transmission period between said first and second transmission periods, a difference detection circuit for detecting a difference between contents of said first and second registers, said difference indicating increase and decrease of said electric current as said change of said electric current, and a decision circuit for supplying an efficiency control signal to said power amplification circuit, said efficiency control signal being determined at a non-transmission period following said second transmission period for a third transmission period following said second transmission period by allocating said non-transmission period between said second and third transmission periods by subtracting an increased amount between said efficiency control signal used at said first transmission period and said efficiency control signal used at said second transmission period from said efficiency control signal used at said second transmission period, when said increase is detected in the difference detection circuit, and by adding said increased amount to said second efficiency control signal used at said second transmission period.

3. An apparatus for controlling an efficiency control signal to be supplied to a power amplification circuit in a time division multiple access mode, comprising:

means for detecting an electric power supplied from a power supply to said power amplification circuit at a present signal transmitting period;

means for detecting whether said electric power is increased or decreased at a period between a signal transmitting period preceding to said present signal transmitting period and said present signal transmitting period, thereby generating an increase signal, when said electric power is increased, and a decrease signal, when said electric power is decreased, respectively;

means for generating said efficiency control signal which is dependent on said increase and decrease signals, said efficiency control signal being a value obtained by subtracting a control value from an efficiency control signal used at said signal transmitting period preceding to said present signal transmitting period, when said increase signal is generated, and said efficiency control signal being a value obtained by adding said control value to said efficiency control signal used at said signal transmitting period preceding to said present signal transmitting period, when said decrease signal is generated.

4. An apparatus for controlling an efficiency control signal according to claim 3, wherein said detecting means comprises a current detection circuit connected to a power supply, an output of said current detection circuit being sampled and held by a sample hold circuit, an output of said sample hold circuit being converted from an analog value to a digital value in an A/D converter connected to an output of said sample hold circuit.

5. An apparatus for controlling an efficiency control signal according to claim 4, wherein an output of said A/D converter is connected to a first register, said first register reading a content of said A/D converter at a rising edge of an input clock generated at a receipt time RX.

6. An apparatus for controlling an efficiency control signal according to claim 5, wherein said first register is connected to a second register, a content of said first register being transferred to said second register at a period prior to a subsequent transmission time TX.

7. An apparatus for controlling an efficiency control signal according to claim 6, wherein said means for detecting whether said electric power is increased or decreased comprises a difference detection circuit having a first input connected to an output of said first register and a second input connected to an output of said second register, said difference detection circuit calculating a difference between a content of said first register and a content of said second register.

8. An apparatus for controlling an efficiency control signal according to claim 7, wherein said efficiency control signal generating means comprises a decision circuit having an input connected to an output of said difference detection circuit, said decision circuit having stored therein an increased amount between a former output value of said decision circuit and an output value preceding said former output value, said decision circuit deciding whether the detected current in the current detection circuit is increased in accordance with a difference supplied from said difference detection circuit.

9. An apparatus for controlling an efficiency control signal according to claim 8, wherein said efficiency control signal generating means further comprises a digital-to-analog converter connected to an output of said decision circuit, said digital-to-analog circuit converting said output of said decision circuit to an analog signal which is input to a weight addition circuit, which weight addition circuit amplifies an output of said digital-to-analog converter to produce an amplification efficiency control signal which is input to said power amplification circuit to provide an optimum power amplification efficiency.

* * * * *